(12) United States Patent
Kuosmanen

(10) Patent No.: US 7,719,374 B2
(45) Date of Patent: May 18, 2010

(54) OSCILLATOR SIGNAL STABILIZATION

(75) Inventor: Vili P. Kuosmanen, Salo (FI)

(73) Assignee: Nokia Corporation, Espoo (FI)

( * ) Notice: Subject to any disclaimer, the term of this patent is extended or adjusted under 35 U.S.C. 154(b) by 140 days.

(21) Appl. No.: 11/819,118

(22) Filed: Jun. 25, 2007

(65) Prior Publication Data

US 2008/0266011 A1 Oct. 30, 2008

(30) Foreign Application Priority Data

Apr. 26, 2007 (FI) .................................... 20075292

(51) Int. Cl.
*H03L 1/00* (2006.01)
(52) U.S. Cl. ........................ 331/175; 331/15; 331/182
(58) Field of Classification Search .................. 331/15, 331/16, 60, 175, 182
See application file for complete search history.

(56) References Cited

U.S. PATENT DOCUMENTS

| | | | | |
|---|---|---|---|---|
| 4,743,867 | A | * | 5/1988 | Smith .......................... 332/127 |
| 5,625,325 | A | | 4/1997 | Rotzoll et al. |
| 6,714,765 | B1 | | 3/2004 | Kimppa |
| 2003/0003887 | A1 | | 1/2003 | Lim et al. |
| 2004/0227578 | A1 | | 11/2004 | Hamalainen |
| 2006/0139106 | A1 | * | 6/2006 | Dosho et al. .................. 331/16 |

FOREIGN PATENT DOCUMENTS

EP   1 244 215 A1   9/2002

OTHER PUBLICATIONS

International Search Report PCT/FI2008/050231 dated Aug. 27, 2008.

\* cited by examiner

*Primary Examiner*—Daniel D Chang
(74) *Attorney, Agent, or Firm*—Squire, Sanders & Dempsey, LLP

(57) ABSTRACT

An oscillator signal stabilization method is provided for a radio transceiver, for example. In the present stabilization method, amplitude variation of a radio frequency oscillator signal generated by a frequency-adjustable oscillator signal generator is stabilized in an adaptive compensation circuit having adjustable compensation parameters. The stabilized oscillator signal is fed from the compensation circuit to one or more frequency dividers for frequency division. The compensation circuit is configured to stabilize signal variations caused by component non-idealities and, thereby, prevent undesired frequency division errors in the frequency dividers.

35 Claims, 3 Drawing Sheets

US 7,719,374 B2

OSCILLATOR SIGNAL STABILIZATION

FIELD

Figure 1:
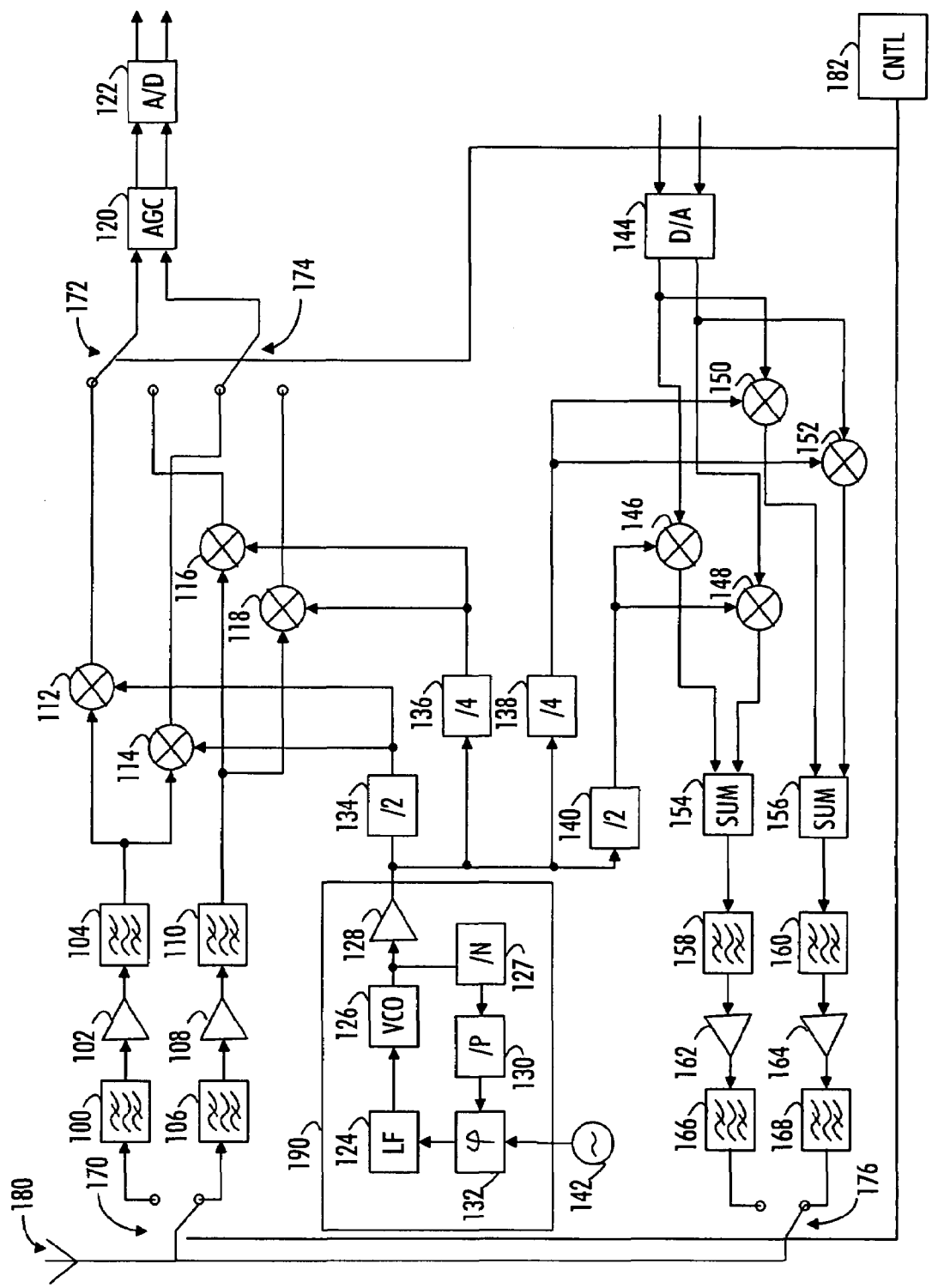

The invention relates to stabilization of an oscillator signal to be applied to a frequency divider.

BACKGROUND

A typical frequency mixer implemented in a radio transceiver comprises a phase-locked loop (PLL) to provide an oscillator signal having a first frequency and one or more frequency dividers dividing the frequency of the oscillator signal output from the PLL to a desired frequency (or frequencies). The output signal of a selected frequency divider is then used for up converting a transmission signal to a desired radio frequency and/or down converting a reception signal from the radio frequency to a baseband.

The performance of a frequency divider is highly dependent on the degree of variation in the level of an input signal. High signal level variation may cause the frequency divider to perform undesired frequency divisions resulting in a distorted oscillator signal in an output of the frequency divider. The degree of the signal level variation may depend on temperature, frequency band, and frequency range supported by the frequency mixer. Signal wires may also cause additional signal variation. For example, jitter is an abrupt and unwanted variation in signal characteristics, such as an interval between successive pulses, the amplitude of successive cycles, or the frequency or phase of successive cycles. Jitter may very well affect the accuracy of rising and falling edges of a digital signal and, thereby, degrade the performance of the frequency divider.

Frequency dividers are typically implemented by digital logic circuits such as counters or flip-flops. Emitter-coupled logic is also known to be used in the frequency dividers. High variation in the input signal of the frequency divider may cause the counter to make a count at an undesired moment, thereby causing an erroneous frequency division. A conventional solution to compensate for the errors caused by signal variation is to deliver the input signal into the frequency divider at a sufficiently high fixed signal level. The problem with this solution is high power consumption and highly variable frequency division performance in cases where the frequency mixer supports a wide frequency range. In the latter case, the high signal level may not be sufficient to fully compensate for a frequency-dependent signal variation. Additionally, the power consumption is a critical factor in devices relying on batteries.

BRIEF DESCRIPTION OF THE INVENTION

An object of the invention is to provide a solution for stabilizing an oscillator signal to be applied into a frequency divider.

According to an aspect of the invention, there is provided a method, comprising: obtaining an oscillator signal originating from a frequency-adjustable oscillator signal generator, stabilizing variations of the oscillator signal in an adaptive compensation circuit having adjustable compensation parameters determined according to at least a frequency of the oscillator signal, and applying the stabilized oscillator signal to a frequency divider for frequency division.

According to another aspect of the invention, there is provided a method, comprising: obtaining an oscillator signal originating from a frequency-adjustable oscillator signal generator, stabilizing the variations of the oscillator signal in two adaptive compensation circuits having adjustable compensation parameters determined according to at least a frequency of the oscillator signal, wherein the two compensation circuits are arranged at different distances from an output of the frequency-adjustable oscillator signal generator, and applying the stabilized oscillator signal to a frequency divider for frequency division.

According to another aspect of the invention, there is provided an apparatus, comprising: an input interface configured to receive an oscillator signal; a first adaptive compensation circuit configured to stabilize variations of the oscillator signal with adjustable compensation parameters determined according to at least a frequency of the oscillator signal; a second adaptive compensation circuit arranged at a different distance from an output of the frequency-adjustable oscillator signal generator than the first adaptive compensation circuit and configured to stabilize the variations of the oscillator signal with adjustable compensation parameters determined according to at least a frequency of the oscillator signal; and an output interface connectable to a frequency divider and configured to output the stabilized oscillator signal.

According to yet another aspect of the invention, there is provided an apparatus comprising an input interface configured to receive an oscillator signal. The apparatus further comprises an adaptive compensation circuit configured to stabilize variations of the oscillator signal with adjustable compensation parameters determined according to at least a frequency of the oscillator signal, and an output interface connectable to a frequency divider and configured to output the stabilized oscillator signal.

According to still another aspect of the invention, there is provided a mobile communication device comprising the apparatus described above.

According to another aspect of the invention, there is provided an apparatus, comprising input means for receiving an oscillator signal. The apparatus further comprises adaptive compensation means for stabilizing variations of the oscillator signal with adjustable compensation parameters determined according to at least a frequency of the oscillator signal, and output means for outputting the stabilized oscillator signal to a frequency divider.

According to another aspect of the invention, there is provided a computer program distribution medium readable by a computer and encoding a computer program of instructions for executing a computer process for controlling a compensation circuit configured to stabilize variations of an oscillator signal. The process comprises: obtaining information on at least frequency properties of the oscillator signal to be applied to at least one frequency divider for frequency division, determining parameters for the compensation circuit from at least the frequency properties of the oscillator signal, and applying to the compensation circuit a control signal defining the parameters of the compensation circuit.

LIST OF DRAWINGS

Figure 2:
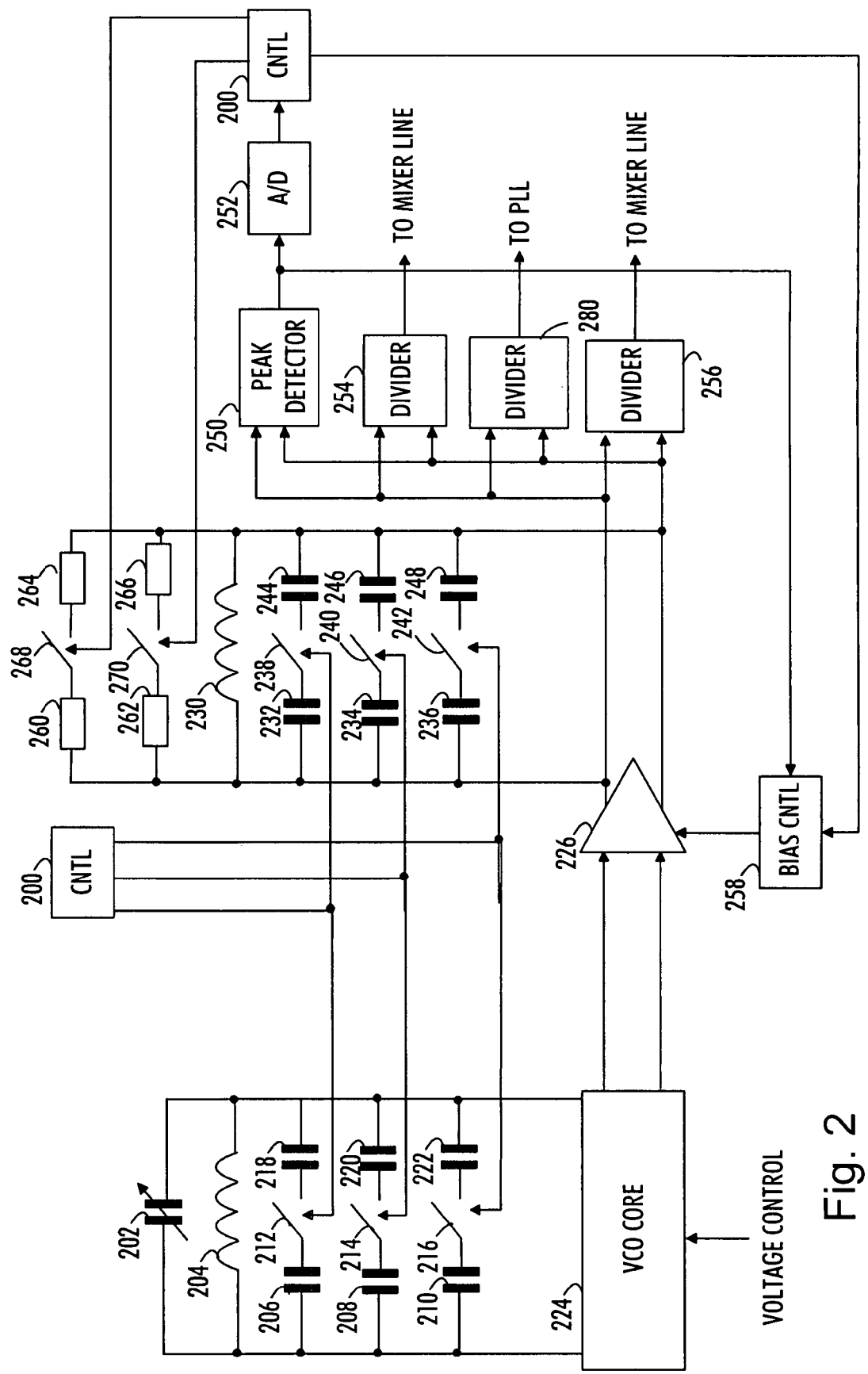
Figure 3:
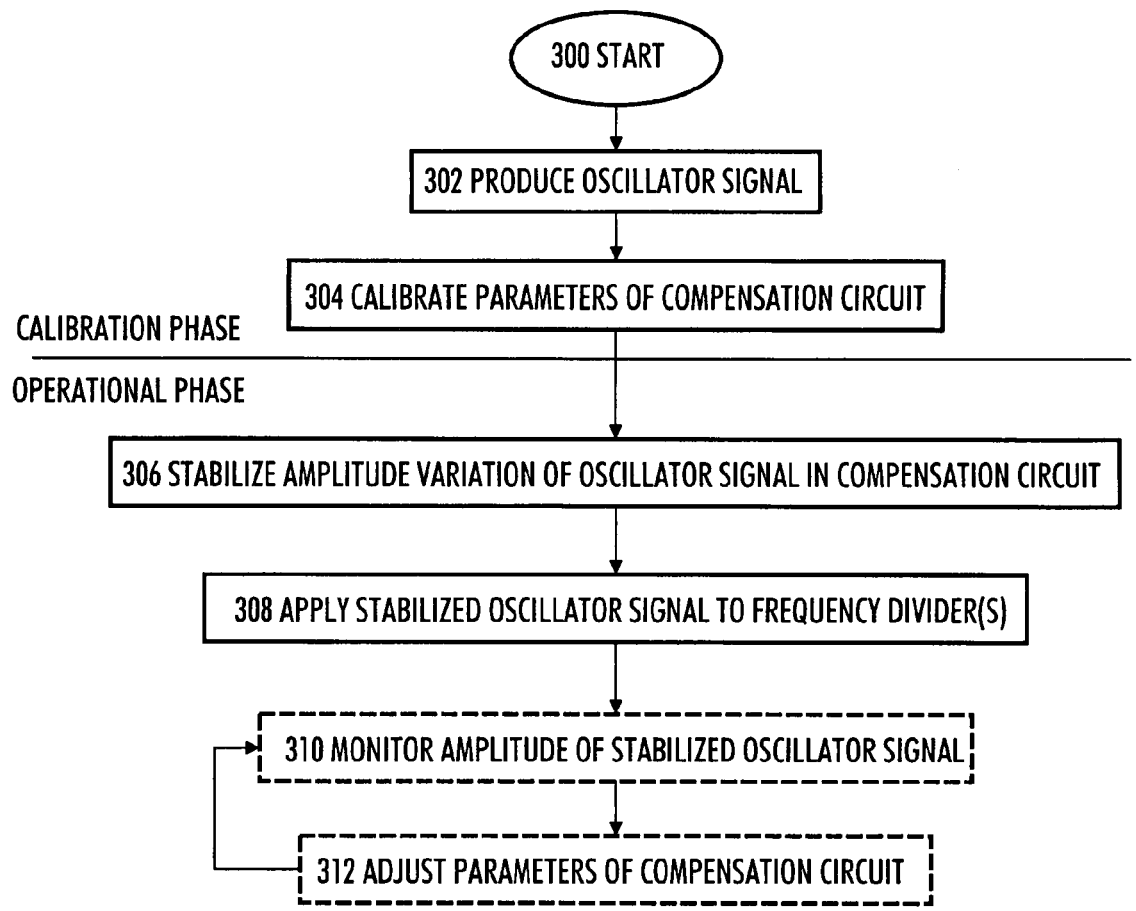

In the following, the invention will be described in greater detail with reference to the embodiments and the accompanying drawings, in which FIG. 1 illustrates a diagram of a direct conversion radio transceiver in which embodiments of the invention may be applied;

FIG. 2 illustrates a structure of a compensation circuit according to an embodiment of the invention, and FIG. 3 illustrates a flow diagram describing a process for stabilizing amplitude variations of an oscillator.

DESCRIPTION OF EMBODIMENTS

With reference to FIG. 1, examine an example of a direct conversion radio transceiver in which embodiments of the invention can be applied. The radio transceiver may be, for example, a mobile communication device such as a cellular telephone, a personal digital assistant, etc. Let us first consider a direct conversion receiver structure of the transceiver. A radio signal is received through an antenna 180 and applied to a switch controlled by a frequency selection controller 182 which controls 170, 172, and 174 according to a transmission frequency of the received radio signal. The transmission frequency is typically negotiated when a communication link is established and, thus it is known to the controller 182. In other words, the controller 182 controls the switch 170 to connect the received radio signal to one of bandpass filters 100, 106. The bandpass filters 100, 106 remove undesired frequency components from the received radio signal and apply the filtered signal to low-noise amplifiers 102, 108, respectively.

After amplification, the signal is once again bandpass filtered in one of bandpass filters 104, 110 (according to the frequency selection). Then, the received radio signal is down-converted in frequency mixers 112 and 114 or 116 and 118. The received radio signal is applied to two frequency mixers to separate an in-phase (I) channel and a quadrature (Q) channel from the received radio signal. Before applying the radio signal to a quadrature channel frequency mixer, the radio signal may be delayed by 90 degrees with respect to the radio signal applied to an in-phase channel frequency mixer.

The frequency mixers 112 to 118 multiply the received radio signal by an oscillator signal having the same frequency as a carrier signal of the received radio signal. The oscillator signal may originate from a frequency synthesizer 190, which may be a phase-locked loop (PLL), for example. A voltage-controlled oscillator (VCO) 126 may provide an oscillator signal to an amplifier 128 acting as a buffer and to a frequency pre-divider 127 included in the PLL. The frequency pre-divider 127 may divide the frequency of the oscillator signal by a fixed division factor N, and output the frequency-divided oscillator signal to a programmable divider 130. The programmable divider 130 divides the frequency of the oscillator signal by a variable factor P selected according to the output frequency of the VCO 126, and outputs the frequency-divided oscillator signal to a phase comparator 132. The phase comparator 132 compares the phase of the oscillator signal provided by the divider 130 with a reference oscillator signal provided by a crystal oscillator 142, for example, and outputs a phase difference signal to a loop filter 124. The loop filter 124 filters the phase difference signal and supplies the signal as a control signal to the voltage controlled oscillator 126, which then adjusts the frequency of the oscillator signal according to the control signal.

An amplified oscillator signal provided by the amplifier 128 is fed to frequency dividers 134, 136, 138, and 140. Frequency dividers 134 and 140 divide the frequency of the oscillator signal by two, and frequency dividers 136 and 138 divide the frequency of the oscillator signal by four. The frequency divider 134 outputs the frequency-divided oscillator signal to the frequency mixers 112 and 114, and the frequency divider 136 outputs the frequency-divided oscillator signal to the frequency mixers 116 and 118. Then, switches select the outputs of either frequency mixers 112 and 114 or frequency mixers 116 and 118 under the control of the frequency selection controller 182, as described above. As a result, the received radio signal is down-converted into an I channel baseband signal and a Q channel baseband signal. The baseband signals are then fed to an automatic gain control amplifier 120 amplifying the signals, and then the analog baseband signals are converted into a digital form in an analog-to-digital converter 122. Then, the digital baseband signals are output for digital signal processing operations such as demodulation and detection.

In a transmitter part of the radio transceiver, a digital-to-analog converter 144 converts a digital transmission signal comprising an I-channel transmission signal and a Q-channel transmission signal into analog waveforms. The converter 144 outputs the I-channel analog signal to frequency mixers 146 and 150 and the Q-channel analog signal to frequency mixers 148 and 152. The frequency mixers 146 and 148 multiply the analog signals by the oscillator signal provided by the divide-by-two divider 140, and the frequency mixers 150 and 152 multiply the analog signals by the oscillator signal provided by the divide-by-four divider 138. The up converted I- and Q-channel signals are then applied to adders 154 and 156 which sum the I-channel and Q-channel signals together. Then, the summed signals are bandpass-filtered in bandpass filters 158 and 160, amplified in amplifiers 162 and 164 and once again bandpass-filtered in bandpass filters 166 and 168. The switch 176 selects one of the transmitter branches according to the transmission frequency to be used in the transmission of the signal. The switch 176 is controlled by the frequency selection controller 182. The selected transmission radio signal is then applied to the antenna 180.

In order to avoid unnecessary operations and minimize power consumption in the transmitter part, the frequency selection controller 182 may turn off the transmitter branch related to the transmission frequency not to be used in the transmission. For example, if a higher transmission frequency is to be used in the transmission, the frequency selection controller 182 may switch off frequency mixers 150 and 152, adder 156, and amplifier 164.

An output signal of the frequency synthesizer 190, i.e. an output signal of either the amplifier 128 or an output signal of the voltage-controlled oscillator 126 should be adjusted before applying the oscillator signal to the frequency dividers 134 to 140 to compensate for signal level variation causing erroneous frequency divisions in the frequency dividers 134 to 140. The signal level variation is typically caused by non-idealities in the components of the frequency synthesizer 190 or in signal lines between the frequency synthesizer 190 and the frequency dividers 134 to 140. The radio transceiver utilizing embodiments of the invention may naturally be provided with more than one frequency synthesizer.

FIG. 2 illustrates a compensation circuit according to an embodiment of the invention. First of all, FIG. 2 illustrates a frequency-adjustable oscillator signal generator, which in this example is a voltage-controlled oscillator (VCO). The VCO includes a VCO core 224 and a resonator circuit. The resonator circuit comprises a switched capacitor matrix including capacitances 206, 208, 210, 218, 220, and 222 and digitally controlled switches 212, 214, and 216. The resonator circuit further comprises an inductance 204 to provide resonance properties in conjunction with the capacitances 206 to 210 and 218 to 222, and an adjustable capacitance 202 to fine-tune the properties of the resonator circuit. The adjustable capacitance 202 may be implemented by a varactor, for example.

The VCO core 224 is an oscillator generator configured to generate a radio frequency (RF) oscillator signal having a frequency tuned by properties of the resonator circuit and a voltage control signal provided by a phase-locked loop (PLL) structure providing a frequency lock for the generation of the oscillator signal. The voltage control signal may be provided by a loop filter, as described in FIG. 1. In fact, the VCO core 224 and the resonator circuit may together form the voltage-controlled oscillator 126 illustrated in FIG. 1.

Utilization of the resonator circuit in tuning the frequency provided by the VCO 126 and in increasing the frequency range of the VCO as such is known in the art and, therefore, the resonator circuit will not be described herein in detail. Generally speaking, the capacitances 206 to 210 and 218 to 222 typically have different capacitance values, and the capacitance matrix is connected in parallel with the inductance 204 and the adjustable capacitance 202. One or more of capacitance pairs 206 and 218, 208 and 220, and 210 and 222 are connected in parallel with the inductance 204 and the adjustable capacitance 202 according to the desired frequency of the oscillator signal to be generated. The capacitances are connected to the resonator circuit by closing the switches 212 to 216 as a response to a control signal provided by a controller 200.

The VCO 126 may be configured to support generation of oscillator signals over a wide frequency range. Each time the VCO 126 is controlled to change the frequency of the oscillator signal, the controller 200 may provide a control signal on the basis of the frequency of the oscillator signal to be generated and close the desired switches 212 to 216 accordingly. The controller 200 may be provided with knowledge of the switch or switches 212 to 216 to be closed for each frequency. When changing the frequency of the oscillator signal generated by the VCO 126, the controller may initiate a calibration phase to be carried out. In the calibration phase, a frequency lock is achieved in the PLL, and parameters of the resonator circuit may be fine-tuned to generate an oscillator signal having a desired frequency. For example, the capacitance value of the adjustable capacitance 202 may be adjusted in the calibration phase. The configuration of the capacitance matrix, i.e. selection of the capacitances 206 to 210 and 218 to 222 with switches 212 to 216, may also be adjusted during the calibration phase to obtain an oscillator signal having a desired center frequency. The change of frequency in this context is not supposed to mean frequency adjustment within the PLL but rather changing the frequency in a frequency hopping radio transmission, for example.

The VCO 126 may provide the actual oscillator signal in a differential mode through two signal lines, as illustrated in FIG. 2. The differential-mode oscillator signal output by the VCO 126 may then be applied to the compensation circuit according to an embodiment of the invention. The oscillator signal may be applied to the compensation circuit through a frequency pre-divider (not shown) configured to pre-divide the frequency of the oscillator signal by a determined frequency division factor.

In other words, a preferred embodiment of the invention is to arrange the compensation circuit between the output of the oscillator signal generation circuit (PLL) and frequency dividers 254, 256 dividing the oscillator signal to a desired up/down conversion frequency and providing a divided oscillator signal to one or more frequency mixer lines. The frequency dividers 254 and 256 performing the final frequency division before the up/down conversion of transmission/reception signals, on the other hand, may be arranged at a relatively long distance from the output of the PLL and, even though the distance may be only a few millimeters, the radio frequency oscillator signal at the input of the frequency dividers 254 and 256 may be severely distorted without the stabilization performed by the compensation circuit according to embodiments of the invention. Therefore, the compensation circuit may be arranged between the VCO 126 and the frequency dividers 254 and 256 to stabilize the oscillator signal.

Additionally, the compensation circuit may be utilized within the PLL to stabilize the oscillator signal input to one or more frequency dividers included in the PLL, e.g. the frequency dividers 127 and 130 illustrated in FIG. 1. Accordingly, the oscillator signal stabilized by the compensation circuit may also be output to a frequency divider 280 belonging to the PLL.

The compensation circuit may comprise an active part, a passive part, and control logic to adjust parameters of the compensation circuit. The control logic may be included in the controller 200. The main function of the compensation circuit is to stabilize amplitude variations of the oscillator signal generated by the VCO 126 before the oscillator signal is applied to frequency dividers 254, 256, and 280 in order to prevent erroneous frequency divisions in the frequency dividers 254, 256, and 280. The erroneous frequency divisions result in a spurious oscillator signal at an output of a frequency divider, thereby causing errors in up/down conversion of information signals in a radio transceiver. The amplitude variations may be caused by non-idealities in components and signal wires between the VCO 126 and the frequency dividers 254, 256, and 280, and the amplitude variation may be variable as a function of a frequency of the oscillator signal and the temperature, for example. In an actual implementation, the distance between the VCO 126 and the frequency dividers 254, 256, and 280 may be rather long, causing variable amplitude distortion in the RF oscillator signal provided by the VCO 126. Therefore, amplitude stabilization may be necessary to ensure proper functionality of the frequency dividers 254, 256, and 280 while keeping the power consumption low.

The active part of the compensation circuit may be implemented by an amplifier 226 controlled by a bias voltage and/or current supplied by a bias control unit 258. An input port of the amplifier 226 may be connected to an output of the VCO 126 and, accordingly, the RF oscillator signal may first be input to the amplifier 226. In case the RF oscillator signal is first frequency-divided in a frequency divider (not shown), the input port of the amplifier may be connected to an output of the frequency divider. The amplifier 226 may roughly correspond to the amplifier 128 illustrated in FIG. 1, but the bias voltage of the amplifier 226 is controlled according to an embodiment of the invention, as will be described below.

The passive part of the compensation circuit may include a resonator circuit similar to that used for controlling the VCO core 224. Similarly to the resonator circuit of the VCO 126, the passive part of the compensation circuit may also comprise a switched capacitance matrix including capacitances 232, 234, 236, 244, 246, and 248 and switches 238, 240, and 242 used for connecting/disconnecting the capacitances between an input port and an output port of the compensation circuit. Furthermore, the passive part may comprise an inductance 230 and one or more resistances 260, 262, 264, and 266. The resistances may also be arranged into a form of an array to be selected with switches 268 and 270. The function of the resonator circuit of the compensation circuit is to affect input impedances of the frequency dividers 254 and 256 such that the oscillator signal is transferred to the frequency dividers at an acceptable level. The actual resonance is caused by the selected capacitances 232 to 236 and 244 to 248 and the inductance 230 arranged in parallel, and the resistances 260 to 266 may be used to fine-tune the resonance properties and, particularly, a quality factor (Q factor) of the resonator circuit.

Similar resonance properties between the two resonator circuits results in that the resonator circuit of the compensation circuit conveys signal components generated by the resonator circuit of the VCO 126 and attenuates other signal components, thereby mitigating distortion caused by the signal lines etc. To enable similar resonance properties in the two resonator circuits, component values of the capacitances 232 to 236 and 244 to 248 and the inductance 230 of the compensation circuit may roughly correspond to the component values of the corresponding components in the resonator circuit of the VCO 126. According to an embodiment of the invention, respective ratios of the corresponding component values are substantially the same in the two resonator circuits. For example, the ratio between the capacitance values of capacitance 206 and capacitance 232 is substantially the same as the ratio between the capacitance values of capacitance 208 and capacitance 234. The passive part of the compensation circuit may be connected between the two signal lines used for transferring the differential-mode oscillator signal, as illustrated in FIG. 2.

As mentioned above, the compensation circuit compensates for amplitude variations in the oscillators signal. From the compensation circuit, the compensated oscillator signal is fed to the frequency dividers 254, 256, and 280. The compensated oscillator signal may be input also to a peak detector 250 (or another amplitude monitoring unit), as will be described later.

Let us now focus on the basic operation and configuration of the compensation circuit. The switched capacitance matrix of the compensation circuit may be controlled with the same input used for controlling the capacitance matrix of the VCO 126. Accordingly, the controller 200 may apply the same control signal to both resonator circuits, thereby closing selected switches 238 to 242 and connecting selected capacitances 232 to 236 and 244 to 248 to the resonator circuit. As mentioned above, the control unit 200 stores control signal configurations for each frequency used in the generation of oscillator signals, and the control unit 200 also has knowledge of a frequency hop pattern, i.e. which frequency is used at a given time interval. The control signal configurations may be stored in a production phase in which the component values of the resonator circuit are also defined according to the frequency range to be supported by the VCO 126. On the basis of the desired frequency of the oscillator signal to be generated, the controller 200 checks stored information about a digital control signal to be used and applies the digital control signal to both resonator circuits. In the example illustrated in FIG. 2, a three-bit control signal may be used for controlling the resonator circuits. A first bit is applied to the switches 212 and 238, thereby either closing the switches 212, 238 or leaving them open according to the bit value. A second bit is applied to the switches 214 and 240, and a third bit is applied to the switches 216 and 242.

As described above, the controller 200 may initiate a short calibration phase when the frequency is changed to ensure a proper oscillation of the RF oscillator signal and the properties of the resonator circuits. At the start of the calibration phase, the controller 200 may configure the bias control unit 258 to supply a constant bias voltage to the amplifier 226, and the bias voltage may be determined according to the frequency of the oscillator signal, i.e. according to the control signal provided by the controller 200. In other words, the controller 200 may also control the operation of the bias control unit 258. At this stage, it should be noted that the two controllers 200 illustrated in FIG. 2 may in practice be one and the same controller 200. While the bias voltage supplied by the bias control unit 258 remains constant, parameters of the passive part of the compensation circuit may be adjusted. As mentioned above, the capacitances 232 to 236 and 244 to 248 of the passive part of the compensation circuit may be selected with the digital control signal provided by the controller 200. During the calibration phase, the amplitude of the oscillator signal at an output of the compensation circuit, i.e. the compensated oscillator signal, may be monitored with the peak detector 250. The peak detector 250 may output analog information on the amplitude, e.g. a detected peak value, of the stabilized oscillator signal to an analog-to-digital (A/D) converter 252, which may convert the analog amplitude information into a digital form and then supply the digital amplitude information to the controller 200 for analysis.

The controller 200 may analyze the amplitude information and adjust the passive part of the compensation circuit to compensate for variation in the amplitude information so as to minimize the difference between the received amplitude information and the reference amplitude. In practice, the controller 200 may adjust at least the Q-factor of the compensation circuit according to the monitored amplitude of the oscillator signal. The adjustment of the Q-factor may be implemented by adjusting the resistance parameters of the compensation circuit. More precisely, the control unit 200 may close at least one of the switches 268 and 270 between the resistances 260, 264 and 262, 266, respectively. The switches may initially be open, and if the monitored amplitude indicates that the Q factor of the resonator circuit of the compensation circuit is too high, the control unit 200 may decrease the Q factor of the compensation circuit by closing an appropriate switch or switches 268, 270.

Additionally, the controller 200 may be configured to also adjust the capacitance and inductance properties of the passive part to affect the resonance frequency of the resonator circuit of the compensation circuit. The passive part of the compensation circuit may comprise additional capacitances and/or inductances to be connected between the input port and the output port of the compensation circuit under the control of the controller 200. Instead of providing the capacitance in the form of the switched capacitance matrix, one or more of the capacitances of the compensation circuit may be provided as fixed between the input port and the output port of the compensation circuit. In this case, the capacitances may be implemented by varactors having an adjustable capacitance value, and the controller may be configured to adjust the capacitance values of the varactors in order to tune the parameters of the compensation circuit. In case one or more switches 212 to 216 of the resonator circuit of the VCO 126 are closed/open during the calibration phase, the corresponding switch(es) 238 to 242 of the compensation circuit are also closed/open due to the same control signal applied to both capacitance matrices.

The A/D converter 252 may be replaced by a comparator structure which compares the amplitude received from the peak detector 250 with a reference level and outputs a first signal, if the received amplitude is lower than the reference level, and, if the received amplitude is higher than the reference level, outputs a second signal. In this case, the controller 200 receives information on whether the amplitude is above or below the reference level but not information on the exact amplitude of the oscillator signal. The controller 200 may adjust the Q factor of the compensation circuit as described above.

When the parameters of the passive part have been adjusted, parameters of the active part may be adjusted. In practice, the bias voltage of the amplifier is controlled according to the amplitude of the monitored oscillator signal. The peak detector 250 may provide the bias control unit 258 with the amplitude information. The bias control unit 258 may comprise an analog part which is configured to compare the amplitude information received from the peak detector 250 with a reference amplitude and adjust the bias voltage of the amplifier 226 according to the difference between the received amplitude information and the reference amplitude. The bias control unit 258 may increase the bias voltage, if the received amplitude information is lower than the threshold amplitude, and decrease the bias voltage, if the received amplitude information is higher than the threshold amplitude. The analog part may be implemented by a comparator which compares the amplitude of the oscillator signal with the reference amplitude and controls a voltage supply unit accordingly. Other implementations are also possible. An inherent feature and advantage of the analog part is that it provides a fast response to a difference between the in the amplitude of the oscillator signal and the reference amplitude.

An adjustment of the bias voltage of the amplifier 226 in the calibration phase may also be carried out digitally under the control of the controller 200. Similarly to the adjustment of the passive part of the compensation circuit, the controller 200 may compare the amplitude information received from the peak detector 250 through the A/D converter 252 with the reference amplitude and provide the bias control unit 258 with a digital control signal instructing the bias control unit 258 to adjust the bias voltage towards the reference amplitude. The bias control unit 258 may also include a digital part configured to receive digital control signals and adjust a bias voltage supply unit according to the digital control signal. In case the bias control unit 258 is a purely analog device, the control signal provided by the controller 200 may be converted into an analog signal by a digital-to-analog (D/A) converter (not shown). An advantage of the digital control of the bias voltage is that the controller 200 may monitor the amplitude fluctuation of the oscillator signal within a time window of a determined length and make adjustments according to the behavior of the amplitude within the time window. While not providing as fast a response as the analog control, the digital control is able to prevent oscillation of the bias voltage control.

Only one of the analog and digital adjustments of the bias voltage of the amplifier 226 may be applied. Alternatively, the bias control unit 258 may be configured to utilize both analog and digital control when adjusting the bias voltage. The bias control unit 258 may use the digital control signal for coarse adjustment of the bias voltage and the analog control signal for fine-tuning the bias voltage to provide a fast response to the fluctuation of the amplitude of the oscillator signal. The digital coarse tuning may be carried out periodically, while the analog fine-tuning may be performed continuously.

Furthermore, the passive part of the compensation circuit is adjusted before the active part in the above description. Obviously, the active part may be adjusted before the passive part.

When the calibration phase is finished, i.e. the parameters of the compensation circuit (and the resonator circuit of the VCO 126) have been adjusted, the adjusted component values of the compensation circuit may be kept fixed until the next calibration phase. The next calibration phase may be initiated upon a controlled change in the frequency of the oscillator signal, i.e. when the VCO 126 is configured to change the oscillation frequency. The initiation of the calibration phase may be carried out by the controller 200. This may be a feasible solution when the frequency of the oscillator signal is changed at regular intervals, e.g. in a frequency-hopping radio transmission and reception implemented in the GSM (Global System for Mobile Communications). In the GSM, the frequency-hopping rate is one hop per frame (4.6 μs).

In case the frequency of the oscillator signal is not changed for an extensive period of time, the above-mentioned embodiments may not provide a sufficient performance, because the distortion properties of the oscillator signal may change as a function of the temperature and the temperature of a mobile telephone, for example, may change significantly during a prolonged phone call. The frequency of the oscillator signal may remain constant for long periods of time in case the VCO 126 and the compensation circuit according to an embodiment of the invention are utilized in a radio transceiver communicating according to a WCDMA (Wideband Code Division Multiple Access) communication scheme, for example.

In case the frequency of the oscillator signal is expected to be changed only occasionally, the amplitude monitoring and adjustment of the parameters of the compensation circuit may be performed frequently during an operational phase at regular intervals or even in real-time. The operational phase refers to a phase in which the oscillator signal is fed to the frequency dividers 254 and/or 256 and eventually used for actual up/down conversion in the radio transceiver. The actual operation of the amplitude monitoring and the parameter adjustment is similar to that described above with respect to the calibration phase. The parameters of the active part and the passive part may be adjusted alternately according to the fluctuation of the amplitude of the monitored compensated oscillator signal.

The adjustment of the parameters of the compensation circuit during the operational phase enables adaptation to changing distortion properties of the oscillator signal and, in particular, temperature compensation. Moreover, at least one of the resistances 260 to 266 of the compensation circuit may be a negative or positive temperature coefficient (NTC/PTC) resistor scaled suitably in the production and testing phase and providing inherent response to the changing temperature and, as a result, to the changing distortion properties of the oscillator signal.

Another possibility for the stabilization of the oscillator signal is to use fixed parameters in the compensation circuit in the sense that the parameters are adjusted neither in the calibration phase nor during the operational phase. In such a case, the parameters of the compensation circuit may be defined by the controller 200 as a function of only the frequency of the oscillator signal. The parameters of the compensation circuit may be defined in the production and testing phase and stored into the memory unit. In addition to the selection of the capacitances 232 to 236 and 244 to 248 according to the frequency of the oscillator signal, selection of the resistances 260 to 266 and the bias voltage level may be stored into the memory unit and read by the controller 200 according to the frequency of the RF oscillator signal to be generated. In such an embodiment, the peak detector 250 and the A/D converter 252 (or the comparator) may be omitted. In fact, the controller 200 checks control parameters associated with the desired frequency of the oscillator signal and controls the bias control unit to set a fixed bias level and selects the resistances 260 to 268 by closing/opening the switches 268 and 270 accordingly. The selection of the capacitances of the capacitance matrices of the resonator circuits of the VCO 126 and the compensation circuit may be performed as described above. This solution is optimized in terms of complexity of implementation.

Another possibility is to use fixed parameters for one of the passive part and the active part of the compensation circuit and to adjust the parameters of the other part according to the monitored amplitude level of the stabilized oscillator signal. For example, the parameters of the passive part of the compensation circuit may be adjusted during the calibration phase and kept constant in the operational phase, while the bias voltage of the active part may be adjusted also in the operational phase. Any combination of whether to adjust the parameters of the active and the passive part of the compensation circuit or to keep the parameters fixed during the calibration phase and the operational phase are possible, even though they are not described in detail herein.

Let us now describe a process of finding suitable parameters for the compensation circuit and stabilization of the oscillator signal with reference to FIG. 3. The process starts in block 300. In block 302, the VCO 126 is configured to produce an oscillator signal having a desired frequency. In a calibration phase following a change of configuration of the VCO 126, parameters of the compensation circuit are calibrated in block 304. The calibration may include adapting parameters of the passive part of the compensation circuit and the bias voltage of the active part of the compensation circuit according to the properties of the oscillator signal. Resistance, capacitance, and/or inductance properties of the compensation circuit may be adjusted in the calibration phase, and the bias voltage of an amplifier configured to amplify the oscillator signal may be adjusted to a desired level. The amplitude of a stabilized oscillator signal at the output of the compensation circuit may be monitored during the calibration phase and the adjustment may be made according to the monitored amplitude to tune the amplitude of the stabilized oscillator signal to a desired level.

When the calibration phase has been completed and the parameters of the compensation circuit have been optimized, the amplitude variation of the oscillator signal is stabilized in the compensation circuit with the adjusted parameters in block 306. From the compensation circuit the stabilized oscillator signal is fed to one or more frequency dividers in block 308. Optionally, the amplitude of the stabilized oscillator signal at the output of the compensation circuit may be monitored periodically or even in real-time in block 310, and the parameters of the compensation circuit may be adjusted in block 312 according to the amplitude monitored in block 310. Thereafter, the monitoring of the amplitude of the stabilized oscillator signal may be resumed in block 310.

In the above description, the same compensation circuit has been used when stabilizing the oscillator signal to be applied to frequency dividers 254, 256, and 280. Depending on the actual implementation and different distortion properties of non-stabilized signals at the inputs of the frequency dividers 254, 256, and 280, a separate compensation circuit may be arranged for each of the frequency dividers 254, 256, and 280. For example, if the distances between the VCO 126 and the dividers 254, 256, 280 differ from one another significantly, the distortion caused by the signal wires may also be significantly different and, thus, separate compensation circuits may provide an optimal stabilization for the oscillator signals to be applied to the frequency dividers 254, 256, and 280. The separate compensation circuits may be configured to operate in parallel with respect to each other. Additionally, a separate peak detector and subsequent parameter adjustment scheme may be arranged for each compensation circuit.

The compensation circuit may be arranged between the two signal lines carrying the differential-mode oscillator signal from the VCO 126 to the frequency dividers 254, 256, and 280. In such a case, the compensation circuit and, particularly, the passive part are of a parallel type. The compensation circuit may be located appropriately depending on the implementation. For example, if a common compensation circuit is employed for every frequency divider 254, 256, and 280, the compensation circuit may be located roughly in the mid-point between the VCO 126 and the frequency dividers. On the other hand, if a plurality of compensation circuits are utilized, one compensation circuit may be arranged into the output of the VCO core 224, and a separate compensation circuit may be arranged at an input of each of the frequency dividers 254, 256, and 280. In case the differential-mode oscillator signal is applied to a frequency divider through the two signal lines illustrated also in FIG. 2, the compensation circuit may be arranged between the two inputs of the frequency divider. In case the oscillator signal is applied to the frequency divider through a single signal line, the compensation circuit may be arranged between the input of the frequency divider and a reference ground level.

Furthermore, the above description discloses that the same control signal is used for controlling the capacitance matrix of both the VCO 126 and the compensation circuit and that a three-bit control word is used for selecting capacitances of the capacitance matrices, i.e. one bit for each switch 212 to 216 and 238 to 242. Obviously, the invention is limited neither to the utilization of the same control signal for both capacitance matrices nor to the length of the control word. The number of switches in the resonator circuit of the VCO 126, i.e. the length of the control word, may depend on the desired frequency range of the VCO 126. On the other hand, the performance of the compensation circuit may be improved by providing a larger capacitance matrix with a larger variety of selectable capacitance values. In case the capacitance matrix of the compensation circuit has a different number of switches than the capacitance matrix of the VCO 126, the controller 200 may apply different control signals to the different resonator circuits. Moreover, the controller 200 may adjust at least the control signal applied to the compensation circuit during the calibration phase. The adjustment may be carried out in order to tune the resonance properties of the passive part of the compensation circuit, and the adjustment may be based on monitoring the compensated oscillator signal. In other words, the controller 200 may adjust the capacitance, in addition to the resistance, of the compensation circuit during the calibration phase to select the most optimal capacitances of the capacitance matrix for the current distortion properties of the oscillator signal.

The operation of the controller 200 may be defined by a computer program executed in the controller 200. The computer program may comprise instructions controlling the controller 200 to perform at least some of the steps illustrated in the flow diagram of FIG. 3. In other words, the computer program may configure the controller 200 to receive information on amplitude properties of an oscillator signal to be applied to a frequency divider for frequency division, to determine parameters for the compensation circuit from the received amplitude properties of the oscillator signal, and to apply to the compensation circuit a control signal changing the parameters of the compensation circuit.

The computer program may be stored on a computer program distribution medium readable by a computer or a processor. The computer program medium may be, for example but not limited to, an electric, magnetic, optical, infrared or semiconductor system, device or transmission medium. The computer program medium may include at least one of the following media: a computer readable medium, a program storage medium, a record medium, a computer readable memory, a random access memory, an erasable programmable read-only memory, a computer readable software distribution package, a computer readable signal, a computer readable telecommunications signal, computer readable printed matter, and a computer readable compressed software package.

Even though the invention has been described above with reference to an example according to the accompanying drawings, it is clear that the invention is not restricted thereto but it can be modified in several ways within the scope of the appended claims.

The invention claimed is:

1. A method, comprising:
obtaining an oscillator signal originating from a frequency-adjustable oscillator signal generator;
stabilizing variations of the oscillator signal in an adaptive compensation circuit having adjustable compensation parameters determined according to at least a frequency of the oscillator signal; and
applying the stabilized oscillator signal to a frequency divider for frequency division.

2. The method of claim 1, further comprising adjusting at least one of resistance, capacitance, and inductance of the compensation circuit.

3. The method of claim 1, further comprising connecting selected components of the compensation circuit between an input port and an output port of the compensation circuit according to desired properties of the oscillator signal.

4. The method of claim 1, further comprising:
adjusting amplification factor related to the oscillator signal according to properties of the oscillator signal; and
amplifying the oscillator signal in the compensation circuit with the adjusted amplification factor.

5. The method of claim 1, further comprising:
monitoring an amplitude of the stabilized oscillator signal at least during a calibration phase; and
stabilizing detected amplitude variation in the amplitude of the compensated oscillator signal by correcting the parameters of the compensation circuit.

6. The method of claim 5, further comprising correcting an amplification factor related to the oscillator signal in proportion to the detected amplitude variation to compensate for the detected amplitude variation.

7. The method of claim 6, further comprising adjusting a bias voltage of an amplifier included in the compensation circuit and amplifying the oscillator signal proportionally to a level of the detected amplitude variation of the stabilized oscillator signal.

8. The method of claim 5, further comprising correcting at least one of resistance, capacitance, and inductance of the compensation circuit in response to the detected amplitude variation of the oscillator signal.

9. The method of claim 5, further comprising monitoring the amplitude of the compensated oscillator signal with a peak detector.

10. The method of claim 5, further comprising:
applying the monitored amplitude of the oscillator signal to a digital controller;
determining by the digital controller new parameters for the compensation circuit from the monitored amplitude of the oscillator signal; and
applying a digital control signal to the compensation circuit to adjust the parameters of the compensation circuit.

11. The method of claim 5, further comprising:
monitoring an amplitude of the stabilized oscillator signal during an operational phase; and
stabilizing detected amplitude variation in the amplitude of the compensated oscillator signal by correcting the parameters of the compensation circuit.

12. The method of claim 11, further comprising monitoring the amplitude of the stabilized oscillator signal in real-time.

13. The method of claim 1, further comprising:
controlling the oscillator signal generator with a resonator filter comprising switched capacitors selectable according to an input from a controller;
controlling the compensation circuit at least initially with the same input used for controlling the resonator filter.

14. The method of claim 5, further comprising: starting the calibration phase upon a controlled change in the frequency of the oscillator signal.

15. A method, comprising:
obtaining an oscillator signal originating from a frequency-adjustable oscillator signal generator;
stabilizing variations of the oscillator signal in two adaptive compensation circuits having adjustable compensation parameters determined according to at least a frequency of the oscillator signal, wherein the two compensation circuits are arranged at different distances from an output of the frequency-adjustable oscillator signal generator; and
applying the stabilized oscillator signal to a frequency divider for frequency division.

16. An apparatus, comprising:
an input interface operably connected to an output of a frequency-adjustable oscillator signal generator and configured to receive an oscillator signal originating from the frequency-adjustable oscillator signal generator;
an adaptive compensation circuit configured to stabilize variations of the oscillator signal with adjustable compensation parameters determined according to at least a frequency of the oscillator signal; and
an output interface connectable to a frequency divider and configured to output the stabilized oscillator signal.

17. The apparatus of claim 16, wherein the compensation circuit comprises a passive part configured to include at least one of adjustable resistance, adjustable capacitance, and adjustable inductance.

18. The apparatus of claim 17, wherein the passive part of the compensation circuit comprises a resonator circuit having an adjustable resonance frequency.

19. The apparatus of claim 18, wherein the passive part of the compensation circuit further comprises an adjustable resistance configured to adjust a quality factor of the resonator circuit.

20. The apparatus of claim 16, wherein the input interface is further configured to receive a control signal and the compensation circuit is further configured to connect selected components of the compensation circuit between the input interface and the output interface according to the control signal received through the input interface.

21. The apparatus of claim 16, wherein the input interface is further configured to receive a control signal and the compensation circuit comprises an active part configured to adjust an amplification factor related to the oscillator signal in response to the control signal and to amplify the oscillator signal with the adjusted amplification factor.

22. The apparatus of claim 16, further comprising:
an amplitude monitoring unit configured to monitor an amplitude of the stabilized oscillator signal at least during a calibration phase of the apparatus; and
a controller configured to correct the parameters of the compensation circuit so as to stabilize detected amplitude variation in the stabilized oscillator signal.

23. The apparatus of claim 22, wherein the controller is further configured to correct an amplification factor related to the oscillator signal in proportion to the detected amplitude variation to compensate for the detected amplitude variation.

24. The apparatus of claim 23, wherein the controller is further configured to adjust a bias voltage of an amplifier included in the compensation circuit and to amplify the oscillator signal proportionally to a level of the detected amplitude variation of the stabilized oscillator signal.

25. The apparatus of claim 22, wherein the controller is further configured to correct at least one of resistance, capacitance, and inductance of the compensation circuit in response to the detected amplitude variation of the oscillator signal.

26. The apparatus of claim 22, wherein the amplitude-monitoring unit comprises a peak detector.

27. The apparatus of claim 22, wherein the amplitude-monitoring unit is configured to monitor the amplitude of the stabilized oscillator signal during an operational phase of the apparatus, and the controller is configured to stabilize detected amplitude variation in the amplitude of the compensated oscillator signal by correcting the parameters of the compensation circuit during the operational phase.

28. The apparatus of claim 27, wherein the amplitude-monitoring unit is configured to monitor the amplitude of the stabilized oscillator signal in real-time.

29. The apparatus of claim 16, further comprising:
an oscillator signal generator including a resonator filter comprising switched capacitors selectable according to a received control signal; and
a controller configured to control the compensation circuit at least initially with the same control signal controlling the resonator filter of the oscillator signal generator.

30. The apparatus of claim 22, wherein the controller is configured to initiate the calibration phase upon a controlled change in the frequency of the oscillator signal.

31. The apparatus of claim 22, wherein the compensation circuit is located at an input of the frequency divider.

32. The apparatus of claim 16, wherein the apparatus comprises a mobile communication device.

33. An apparatus, comprising:
an input interface operably connected to an output of a frequency-adjustable oscillator signal generator and configured to receive an oscillator signal originating from the frequency-adjustable oscillator signal generator;
a first adaptive compensation circuit configured to stabilize variations of the oscillator signal with adjustable compensation parameters determined according to at least a frequency of the oscillator signal;
a second adaptive compensation circuit arranged at a different distance from an output of a frequency-adjustable oscillator signal generator than the first adaptive compensation circuit and configured to stabilize the variations of the oscillator signal with adjustable compensation parameters determined according to at least the frequency of the oscillator signal; and
an output interface connectable to a frequency divider and configured to output the stabilized oscillator signal.

34. An apparatus, comprising:
input means, operably connected to an output of a frequency-adjustable oscillator signal generator, for receiving an oscillator signal originating from the frequency-adjustable oscillator signal generator;
adaptive compensation means for stabilizing variations of the oscillator signal with adjustable compensation parameters determined according to at least a frequency of the oscillator signal; and
output means for outputting the stabilized oscillator signal to a frequency divider.

35. A computer program distribution medium encoding a computer program configured to control a compensation circuit configured to stabilize variations of an oscillator signal to perform:
obtaining information on at least frequency properties of the oscillator signal to be applied to at least one frequency divider for frequency division;
determining parameters for the compensation circuit from at least the frequency properties of the oscillator signal; and
applying to the compensation circuit a control signal defining the parameters of the compensation circuit.

* * * * *